(12) United States Patent
Schautzgy et al.

(10) Patent No.: US 12,173,701 B2
(45) Date of Patent: Dec. 24, 2024

(54) POSITIVE DISPLACEMENT PUMP DEVICE

(71) Applicant: ETO MAGNETIC GmbH, Stockach (DE)

(72) Inventors: Maximilian Schautzgy, Meersburg (DE); Thomas Schiepp, Seitingen-Oberflacht (DE); Markus Laufenberg, Stockach (DE)

(73) Assignee: ETO MAGNETIC GmbH, Stockach (DE)

( * ) Notice: Subject to any disclaimer, the term of this patent is extended or adjusted under 35 U.S.C. 154(b) by 883 days.

(21) Appl. No.: 17/251,406

(22) PCT Filed: Jun. 12, 2019

(86) PCT No.: PCT/EP2019/065370
§ 371 (c)(1),
(2) Date: Dec. 11, 2020

(87) PCT Pub. No.: WO2019/238768
PCT Pub. Date: Dec. 19, 2019

(65) Prior Publication Data
US 2021/0246891 A1    Aug. 12, 2021

(30) Foreign Application Priority Data

Jun. 13, 2018  (DE) .................... 10 2018 114 166.1

(51) Int. Cl.
*F04B 43/14*   (2006.01)
*B01L 3/00*   (2006.01)
(Continued)

(52) U.S. Cl.
CPC ...... *F04B 43/0054* (2013.01); *B01L 3/50273* (2013.01); *F04B 43/043* (2013.01); *F04B 43/14* (2013.01)

(58) Field of Classification Search
CPC .................... F04B 19/006; F04B 43/0054; F04B 43/0072; F04B 43/084; F04B 43/12;
(Continued)

(56) References Cited

U.S. PATENT DOCUMENTS 9,091,251 B1 *  7/2015  Ullakko .................. F03G 6/121
10,581,345 B2 *  3/2020  Patel ...................... H10N 35/00
(Continued)

FOREIGN PATENT DOCUMENTS

CN      106560620 A    4/2017
DE     102016110669 A1   6/2016

OTHER PUBLICATIONS

Author: Roger Guiel et al. Title: The effect of magnetic field orientation on the open-circuit voltage of Ni—Mn—Ga based power harvesters Date accessed (mm/dd/yyyy): Dec. 30, 2023 Link: https://iopscience.iop.org/article/10.1088/1361-665X/aacfd6 (Year: 2018).*

(Continued)

*Primary Examiner* — Kenneth J Hansen
*Assistant Examiner* — Chirag Jariwala
(74) *Attorney, Agent, or Firm* — Posz Law Group, PLC

(57) ABSTRACT

A positive-displacement pump device has at least one shape-memory unit including at least one magnetic shape-memory element, which is configured to convey at least one medium along at least one transport direction, wherein the positive-displacement pump device includes at least one deformation unit, which is configured, for the purpose of providing a transport volume, to deform the magnetic shape-memory element, at least in an idle state in which the positive-displacement pump device is free of a current and/or voltage supply, by a pressure force and/or traction force acting in the transport direction such that the magnetic shape-memory element includes at least one first partial region and at least (Continued)

Figure 1:
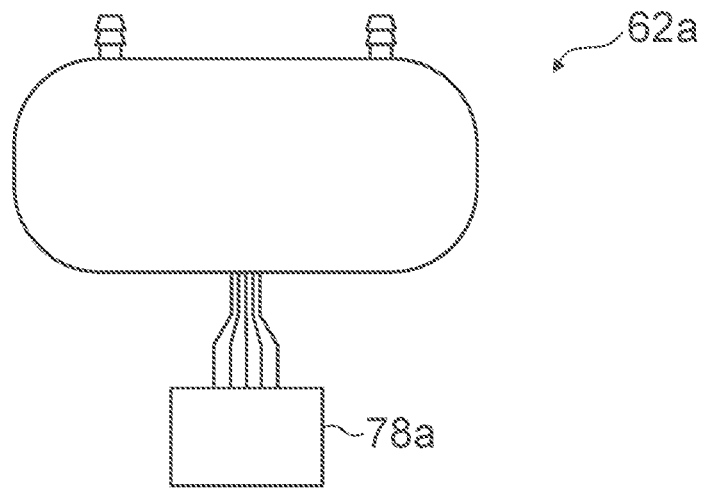

one second partial region which differ from one another at least by their magnetic orientations.

23 Claims, 6 Drawing Sheets

(51) Int. Cl.
  *F04B 43/00* (2006.01)
  *F04B 43/04* (2006.01)
(58) Field of Classification Search
  CPC ...... F04B 43/043; F04B 43/047; F04B 43/14; F04B 45/10; H10N 35/00; H10N 35/80; H01F 1/0308; B01L 3/50273
  See application file for complete search history.

(56) References Cited

U.S. PATENT DOCUMENTS

| | | | |
|---|---|---|---|
| 2010/0221124 A1* | 9/2010 | Ikushima | F04B 43/0045 417/413.1 |
| 2014/0041761 A1 | 2/2014 | Ezer et al. | |
| 2015/0118077 A1* | 4/2015 | Humburg | F04B 17/003 417/322 |
| 2016/0211065 A1 | 7/2016 | Mullner et al. | |
| 2016/0301293 A1 | 10/2016 | Mullner | |
| 2017/0096989 A1 | 4/2017 | Humburg | |
| 2019/0089268 A1* | 3/2019 | Patel | F03G 7/065 |
| 2019/0304651 A1 | 10/2019 | Laufenberg et al. | |
| 2020/0188912 A1* | 6/2020 | Ullakko | H01F 1/0308 |

OTHER PUBLICATIONS

Author: Pagounis et al. Title: Recent developments in magnetic shape memory actuation Date accessed: May 31, 2024 Link: https://scholar.google.com/scholar_lookup?title=Recent+developments+in+magnetic+shape+memory+actuation&author=E+Pagounis&author=P+M%C3%BCllner&publication_year=2014&pages=86-91 (Year: 2014).*
Author: Wikipedia Title: Magnetic shape-memory alloy Date accessed: May 28, 2024 Link: https://web.archive.org/web/20170320224243/https://en.wikipedia.org/wiki/Magnetic_shape-memory_alloy (Year: 2017).*
Samuel Barker, et al.; "Magnetic Shape Memory Micropump for Submicroliter Intracranial Drug Delivery in Rats," Journal of Medical Devices, 2016, vol. 10, Issue 4; one page abstract only.
German Search Report dated Feb. 19, 2019, issued in corresponding DE Patent Application No. 102018114166.1 (and English Machine Translation).
International Search Report dated Nov. 15, 2019, issued in corresponding EP Patent Application No. 2019-065370.
International Preliminary Report on Patentability and Written Opinion of the International Searching Authority dated Dec. 15, 2020, issued in corresponding EP Patent Application No. 2019-065370.
Chinese Office Action issued on Feb. 25, 2022 in corresponding CN Patent Application No. 201980050710.6 (English summary attached).

* cited by examiner

POSITIVE DISPLACEMENT PUMP DEVICE

CROSS REFERENCE TO RELATED APPLICATIONS

This application is a U.S. national stage application of PCT/EP2019/065370 filed on Jun. 12, 2019, which is based on German Patent Application No. 10 2018 114 166.1, filed on Jun. 13, 2018, the contents of which are incorporated herein by reference.

STATE OF THE ART

The invention concerns a positive-displacement pump device and a method for operating a positive-displacement pump device.

From document US 2016/0301293 A1 a micropump is already known which uses an MSM element and an electromagnetic magnet unit for a transport, wherein in an operating state the electromagnetic magnet unit is configured to generate a local longitudinal deformation of the MSM element so as to provide a transport volume.

The objective of the invention is in particular to provide a generic device having improved characteristics regarding its construction, in particular regarding construction space and/or reliability. The objective is achieved according to the embodiments described below.

Advantages of the Invention

The invention is based on a positive-displacement pump device with at least one shape-memory unit comprising at least one magnetic shape-memory element, which is configured to convey at least one medium along at least one transport direction.

In one aspect of the invention, which may in particular be considered on its own or in combination with further aspects of the invention, it is proposed that the positive-displacement pump device comprises at least one deformation unit, which is configured, for the purpose of providing a transport volume, to deform the magnetic shape-memory element at least in an idle state, by a pressure force and/or traction force acting in the transport direction, such that the magnetic shape-memory element comprises at least one first partial region and at least one second partial region which differ from each other at least by their magnetic orientations. This advantageously allows improving a construction of the positive-displacement pump device as it is in particular possible to dispense with structural components which move—and are thus prone to wear down and to faults—for an implementation of the first partial region and/or for a magnetization of the magnetic orientations of the partial regions. Especially advantageously a wear-down of structural components of the positive-displacement pump device can be reduced and/or maintenance intervals can be increased. Further advantageously reliability can be improved as it is possible at any time, even in an idle state, to provide a transport volume for receiving a medium. It is thus in particular avoidable that in case of an, in particular unintended, deactivation of an operating state of the positive-displacement pump device, a medium is unpredictably dispersed, causing damages to the positive-displacement pump device. Further advantageously an especially compact construction is achievable.

A "positive-displacement pump device" is in particular to mean an, in particular operational, component, in particular a structural and/or functional component, of a positive-displacement pump. The positive-displacement pump device in particular forms the positive-displacement pump at least partly and preferably at least to a large extent. Alternatively the positive-displacement pump device may also form the positive-displacement pump completely. The term "at least to a large extent" is here in particular to mean at least by 55%, advantageously at least by 65%, preferentially at least by 75%, particularly preferably at least by 85% and very particularly preferably at least by 95%, and in particular completely. By a "positive-displacement pump" is in particular an, in particular electrically driven, pump to be understood, which uses a positive-displacement mechanism for a transport of at least one medium. The positive-displacement pump in particular comprises at least one closed transport volume, which conveys the medium and which is preferably configured to prevent an undesired flow-back of the medium against the transport direction. Especially advantageously the positive-displacement pump is self-suctioning and is configured to autonomously create a negative pressure for a transport of the medium into the positive-displacement pump, wherein it is in particular possible to do without further negative-pressure components like, for example, an additional negative-pressure pump. "Configured" is in particular to mean specifically programmed, designed and/or equipped. By an object being configured for a certain function is in particular to be understood that the object fulfills and/or carries out said certain function in at least one application state and/or operation state. In particular, the positive-displacement pump is embodied as a micropump. By a "micropump" is in particular a positive-displacement pump to be understood which comprises a construction space of maximally 25 cm$^3$, preferably no more than 15 cm$^3$ and particularly preferably no more than 5 cm$^3$. The positive-displacement pump device is in particular configured for a transport of a medium comprising at least a liquid, at least a gas, at least a solid material, in particular a powder-like solid material, and/or a mixture of such. For example, the medium may comprise at least one liquid with a solid material that is resolved therein, e.g. an active agent, a medicament, or the like.

By a "shape-memory unit" is in particular a unit to be understood which is configured to use at least a shape-memory effect for a transport of the medium. The shape-memory effect used by the shape-memory unit for the transport of the medium is in particular a magnetic shape-memory effect. Alternatively or additionally the shape-memory unit could use a temperature-dependent shape-memory effect. For a transport of a medium it is conceivable that the positive-displacement pump device may comprise at least two shape-memory units, preferentially at least three shape-memory units and especially preferentially a plurality of shape-memory units. Such shape-memory units could, for example, be connected to each other in parallel and/or in series. Very particularly preferably the positive-displacement pump device comprises only one shape-memory unit.

The shape-memory unit may in particular comprise at least two, preferably at least three and particularly preferably a plurality of shape-memory elements, which may in particular be implemented to be separate and/or to be coupled with one another. Very especially preferentially the shape-memory unit comprises one single shape-memory element. By a "shape-memory element" is in particular an element to be understood which is implemented at least partially, preferably at least to a large extent, of a shape-memory material that has at least a structural anisotropy causing a shape conversion like, for example, due to a change in the length and/or in the thickness of the element, and/or that has at least a magnetic anisotropy causing a re-orientation of a magnetic orientation. In particular, the structural anisotropy and the magnetic anisotropy are dependent on each other and/or mutually induce each other. In particular in case of the shape-memory element being realized as a magnetic shape-memory element, the conversion of the anisotropy is at least dependent on a magnetic field, in particular on an orientation of a magnetic field going through the shape-memory element. The shape-memory material comprised by the shape-memory element could in particular be a magnetically shape-shiftable material, like for example a magneto-restrictive material. Preferably, however, the shape-memory element comprises at least one, in particular magnetically effective and/or active, shape-memory material, and particularly preferably a magnetic shape-memory alloy (also known as an MSM material=Magnetic Shape Memory material). Herein the magnetic shape-memory material preferentially contains nickel, manganese and gallium, preferably generating a magnetic shape-memory alloy.

Furthermore the shape-memory unit in particular comprises at least one envelope. At least the shape-memory element is at least partly, preferably at least to a large extent and particularly preferably completely arranged within the envelope and/or enclosed by the envelope. The envelope is configured for sealing the shape-memory element off. The envelope is in particular plastically and preferably elastically deformable. Preferentially the envelope is implemented at least partially of a synthetic material, in particular a plastic and preferably an elastic synthetic material.

For an exchange of the medium with an environment, the shape-memory unit in particular comprises at least two medium pass-throughs, which are in particular arranged offset from each other in a transport direction and which are configured for an inlet and/or outlet of the medium. The medium pass-throughs are in particular implemented by recesses of the envelope. Preferably the pump device has one single transport direction, such that preferentially one medium pass-through forms a medium inlet and at last one further medium pass-through forms a medium outlet. The medium pass-throughs are preferably arranged on different, in particular opposite-situated, end sections of the shape-memory unit. By an "end section" is in particular a section to be understood which, starting from a free end of an object, extends into the object, in particular by maximally 3 cm, preferably by maximally 1 cm and particularly preferably by maximally 0.25 cm. In particular, the medium pass-throughs are arranged on a same side of the shape-memory unit. The shape-memory unit may moreover comprise two further medium pass-throughs, which are arranged on a further side of the shape-memory unit that is different from a side of the shape-memory unit which the medium pass-throughs are arranged on and which is preferably situated opposite thereto.

The shape-memory unit is in particular at least partly, preferably at least to a large extent and particularly preferably completely embodied as an elongate object. In particular, the shape-memory element and/or the envelope of the shape-memory unit are/is embodied as an elongate object. An "elongate object" is in particular to mean an object having a dimension perpendicularly to the main extension of the object that is smaller than its main extension at least by a factor of 2, preferably at least by a factor of 5 and particularly preferably at least by a factor of 10. A "main extension" of an object is in particular to mean an extension of an object along a main extension direction of the object, which advantageously goes through a geometrical center and/or a mass center of the object. A "main extension direction" of an object is in particular to mean a direction oriented parallel to a longest edge of a smallest imaginary rectangular cuboid just still completely enclosing the object. Preferentially the shape-memory element has the shape of a rod. In particular viewed in the transport direction, the shape-memory element has a quadrangular cross section. The cross section in particular comprises four side surfaces, which define the sides of the shape-memory unit. The shape of the envelope is in particular realized correspondingly to the shape of the shape-memory element. Preferably the envelope has the shape of a flexible tube. In particular viewed in the transport direction, the envelope has a quadrangular cross section.

The transport direction is in particular at least substantially parallel to the main extension direction at least of the shape-memory element, of the envelope and/or of the shape-memory unit. "At least substantially parallel" is here in particular to mean an orientation of a direction relative to a reference direction, in particular in a plane, with the direction and the reference direction including an angle of 90°, in particular under consideration of a maximum deviation by less than 8°, advantageously less than 5° and especially advantageously by less than 2°. Preferentially the transport direction is identical to the main extension direction at least of the shape-memory element, of the envelope and/or of the shape-memory unit.

An "idle state" of the positive-displacement pump device is in particular to mean a state that differs from an operation state in which the positive-displacement pump device actively conveys a medium along the transport direction. In particular, the idle state is a state in which a transport volume of the positive-displacement pump device is at a standstill. Preferentially the idle state is a state in which the positive-displacement pump device is free of an energy supply, wherein in particular no electric current flows through the positive-displacement pump device and/or no electric voltage is applied at the positive-displacement pump device.

By a "deformation unit" is in particular a unit to be understood which provides at least a pressure force and/or traction force for a deformation at least of the shape-memory element and preferably for a deformation of the shape-memory unit. For this purpose the deformation unit may in particular tension and/or compress the shape-memory element intrinsically or by external force impact. The deformation unit in particular provides the pressure force and/or tension force via mechanical and/or magnetic interaction with the shape-memory unit, in particular with the shape-memory element. Preferably the deformation unit forms a support in which the shape-memory unit, in particular at least the shape-memory element, is clamped.

A "transport volume" is a volume that is delimited by at least one second partial region at least in parallel to the transport direction, and which is preferably enclosed between two second partial regions neighboring the first partial region and/or which is encompassed by the envelope at least substantially perpendicularly to the transport direction. "At least substantially perpendicularly" is here in particular to mean an orientation of a direction relative to a reference direction, in particular in a plane, with the direction and the reference direction including an angle of 0°, in particular under consideration of a maximum deviation by less than 8°, advantageously by less than 5° and especially advantageously by less than 2°.

The first partial region and the second partial region differ from one another in particular by different orientations of their magnetic anisotropies and/or of their structural anisotropies resulting from their different magnetic orientations and/or dimensions. By a "magnetic anisotropy" is in particular to be understood that there is a preferred magnetic direction. In particular, the magnetic anisotropy brings about a coupling of the magnetization to a crystal lattice. An "orientation of a magnetic anisotropy" is in particular to mean an orientation of a preferred direction of the magnetic anisotropy. By a "structural anisotropy" is in particular to be understood that there is a preferred structural direction, which is, for example, the case in a crystal lattice that is implemented differently from a cubical crystal lattice. An "orientation of a structural anisotropy" is in particular to mean an orientation of a preferred direction of the structural anisotropy. In particular, the orientations of the magnetic anisotropy and the structural anisotropy, or in other words their respective preferred directions, are linked to one another, in particular via the crystal lattice. Preferentially the magnetic orientation of the first partial region is at least substantially perpendicular to the magnetic orientation of the second partial region. Preferably the magnetic orientation of the first partial region is at least substantially parallel to the transport direction. Further preferably the magnetic orientation of the second partial region is at least substantially parallel to the transport direction.

In a further aspect of the invention, which may in particular be considered separately as well as in combination with further aspects of the invention, it is proposed that the positive-displacement pump device comprises at least one permanent-magnetic magnet unit, which is configured, at least in an idle state, to subject the magnetic shape-memory element to a magnetic field such that the magnetic shape-memory element comprises at least one first partial region and at least one second partial region, which differ from one another at least by their magnetic orientations, and comprises at least one electromagnetic magnet unit, which is configured to move at least the first partial region in the transport direction. This advantageously allows improving a construction of the positive-displacement pump device as it is in particular possible to do without moving—and thus wear-prone and fault-prone—structural components for an implementation of the first partial region and/or for a magnetization of the magnetic orientation of the partial regions.

By a "magnet unit" is in particular a unit to be understood which is configured to provide and/or generate a magnetic field acting onto the shape-memory element. Advantageously the magnet unit is configured to provide a magnetic field whose magnetic field main axis is oriented at least substantially perpendicularly and/or at least substantially parallel to the transport direction. Especially advantageously the magnet unit is configured, in at least one operation state, in particular via the magnetic field, to bring about a deformation of the shape-memory element. Furthermore the magnet unit is advantageously at least partly arranged in a proximity of the shape-memory unit. By a "proximity" is in particular a spatial region to be understood which consists of points having a distance from a reference point and/or a reference component, in particular the shape-memory unit, that is smaller than a third, preferably smaller than a quarter, preferentially smaller than a sixth and particularly preferentially smaller than a tenth of the main extension of the shape-memory unit, and/or respectively having a distance of maximally 20 mm, preferably maximally 10 mm and particularly preferably maximally 5 mm from a reference point and/or a reference component, in particular the shape-memory unit.

The magnet unit comprises at least one magnet element, which is embodied as an electromagnetic and/or permanent-magnetic magnet element. In particular, the magnet unit comprises at least two, preferably at least three and especially preferentially a plurality of magnet elements, which are in particular implemented at least substantially identically. The magnet elements are in particular implemented and actuatable separately from one another and/or are preferably arranged offset relative to one another, in particular offset in the transport direction. "At least substantially identically" is in particular to mean identically except for manufacturing and/or assembly tolerances.

By a permanent-magnetic magnet unit" is in particular a magnet unit to be understood in which at least one magnet element, preferably a large portion of all magnet elements and particularly preferably all magnet elements of the magnet unit is/are embodied as permanent-magnetic magnet elements. Preferentially a permanent-magnetic magnet unit is free of electromagnetic magnet elements. By a "permanent-magnetic magnet element" is in particular a magnet element to be understood which is implemented at least partially, preferably at least to a large extent and particularly preferably completely of a permanent-magnetic material. The permanent-magnetic magnet element in particular maintains a, preferably static, magnetic field without an electric current flowing and/or a voltage being applied. By a "permanent-magnetic material" is in particular a magnetic material to be understood which, in particular after an initial magnetization, has remanence. Advantageously the permanent-magnetic material herein has a remanence flux density of at least 0.2 T, in particular at least 0.4 T and in particular at least 0.6 T. The permanent-magnetic material in particular comprises at least one hard-magnetic material like, for example, at least iron, at least cobalt, at least nickel, at least ferrite and/or an alloy thereof.

By an "electromagnetic magnet unit" is in particular a magnet unit to be understood in which at least one magnet element, preferably a large portion of all magnet elements and particularly preferably all magnet elements of the magnet unit is/are embodied as electromagnetic magnet elements. In particular, an electromagnetic magnet unit is free of permanent-magnetic magnet elements. By an "electromagnetic magnet element" is in particular a magnet element to be understood which comprises at least one conductor loop that is in an operating state configured to be flown-through by a current, and/or which a voltage is applied at. In particular, the electromagnetic magnet element comprises at least two, preferentially at least three and especially preferentially a plurality of conductor loops. The electromagnetic magnet element is in particular implemented as a coil, preferably an air-core coil.

A magnet unit, in particular a magnet unit implemented as a permanent-magnetic magnet unit, may in particular at least partially form the deformation unit, may be realized at least partly integrally with the deformation unit and/or may be identically thereto. For this purpose the magnet unit is capable of re-orienting the magnetic anisotropy of the shape-memory material via a magnetic field is provided by the magnet unit and which the shape-memory unit is subjected to, thus enabling an implementation of the first partial region. For this case a magnetic field main axis of the magnet unit is oriented at least substantially perpendicularly to the transport direction. Alternatively or additionally the magnet unit is capable of re-orienting the structural anisotropy via inducing a magnetic interaction with the shape-memory unit by providing a magnetic field with a magnetic field main axis that is oriented substantially parallel to the transport direction, which results in a pressure force and/or traction force acting onto the shape-memory element, thus enabling an implementation at least of the first partial region.

By a first object and a second object being realized "at least partly integrally" with each other is in particular to be understood that at least one element and/or portion of the first object is realized integrally with at least one element and/or portion of the second object. Especially preferentially "integrally" is also to mean in a one-part implementation. "In a one-part implementation" is in particular to mean formed in one piece. This piece is preferably produced from a single blank, one mass and/or one cast, particularly preferably in an injection-molding process, in particular in a one-component and/or multi-component injection molding process.

By a "magnetic field main axis" of a magnetic field is in particular an axis to be understood which extends along a maximum magnetic field intensity. In particular, the magnetic field main axis is at least substantially parallel to and preferably coaxial with a symmetry axis and/or a main extension of a magnet element and/or a magnet unit which provides and/or generates the magnetic field comprising the magnetic field main axis. For example, for the case of an electromagnetic magnet element, a magnetic field main axis is at least substantially parallel to und/or coaxial with a symmetry axis of the conductor loop, in particular of the coil, of the electromagnetic magnet element. Furthermore, for the case of a permanent-magnetic magnet element, a magnetic field main axis is at least substantially parallel to and/or coaxial with an extension, in particular a main extension, of the magnet element, which in particular connects opposite-situated surfaces of north pole and south pole by a shortest way.

In particular, a magnet unit, preferably a magnet unit embodied as an electromagnetic magnet unit, is configured for moving at least the first partial region in the transport direction. Preferentially, when activated the electromagnetic magnet unit pushes the first partial region in front of it. Alternatively it is conceivable that the electromagnetic magnet unit at least partially changes an orientation of a partial region, thus creating and/or deleting partial regions having different magnetic orientations in different positions along the shape-memory element. It is in particular conceivable that the electromagnetic magnet unit re-orients partial regions whose orientation has been changed by the permanent-magnetic magnet unit and converts them into second partial regions.

It is further proposed that the first partial region has a smaller dimension perpendicularly to the transport direction than the second partial region. Advantageously it is possible to provide a transport volume in an efficient and simple manner. In particular, the dimension is smaller at least by 2%, preferably at least by 5% and particularly preferably at least by 10%. Due to its smaller dimension as compared to the second partial region, the first partial region forms the transport volume between itself and the envelope that encloses the shape-memory element. In particular, the transport volume is delimited by a neighboring second partial region at least from one side. Herein a fluid-tight sealing of the transport volume in the transport direction is in particular brought about by the second partial region together with the envelope.

To achieve an especially large transport volume, the first partial region could extend over a large portion of an extension of the magnetic shape-memory element. However, particularly preferably it is proposed that the first partial region extends over a small fraction of an extension of the magnetic shape-memory element along the transport direction. It is advantageously possible that an especially small transport volume is conveyed and outputted. Further advantageously it is possible to improve a precision of a transport quantity that is to be outputted. A "small fraction" is in particular to mean less than 25%, preferably less than 15% and particularly preferably less than 5% of an entity.

Beyond this it is proposed that the magnetic shape-memory element comprises at least two first partial regions and at least two second partial regions. This advantageously enables an improvement of a pump performance. In particular, a higher throughput of the medium is achievable. In particular, respectively one first partial region is adjacent, in particular directly adjacent, to at least one second partial region. It is also conceivable that the magnetic shape-memory element comprises a plurality of first partial regions and a plurality of second partial regions. Preferentially the magnetic shape-memory element comprises an even number of first partial regions and an uneven number of second partial regions, or vice versa.

It is conceivable that the deformation unit is at least partially arranged such that it extends at least substantially parallel along the shape-memory unit. In particular for further improving a construction, it is proposed that the deformation unit is at least partly arranged on an end section of the shape-memory unit. Preferably the deformation unit is arranged on two opposite-situated end sections of the shape-memory unit, in particular for the case that the deformation unit forms a support for the shape-memory unit.

Furthermore it is proposed that the deformation unit is arranged at least partly coaxially around the magnetic shape-memory element. This advantageously allows reducing a construction space. In particular for this case, the deformation unit is implemented by a magnet unit, in particular the afore-mentioned magnet unit, preferably the permanent-magnetic magnet unit. By the term that "two objects are arranged coaxially" is in particular to be understood that the objects have a common symmetry axis, around which the objects are arranged, preferably mutually encompassing each other.

In particular to achieve an adjustability of a transport volume and/or of a transport quantity that is to be outputted, it is advantageously proposed that the deformation unit is configured for an adjustment of different deformation degrees of a deformation of the magnetic shape-memory element. In particular, the deformation degree is variably adjustable by a variation of the traction force and/or pressure force provided by the deformation unit. In particular, for the case of the deformation unit comprising at least one magnet element, is in particular if the deformation unit is realized at least partly integrally with the magnet unit and/or by the magnet unit, the traction force and/or the pressure force may be adjustable via a magnetic field intensity. In particular for the case of such a magnet element and/or such a magnet unit being embodied as an electromagnetic magnet element and/or an electromagnetic magnet unit, the magnetic field intensity and thus in particular the traction force and/or the pressure force may be adjustable via a current and/or a voltage which said electromagnetic magnet element and/or electromagnetic magnet unit are/is operated with.

It is also proposed that the deformation unit comprises at least one mechanism which, for a mechanical deformation, applies a pressure force and/or a traction force to the magnetic shape-memory element. Advantageously, it is in this way possible to provide a pressure force and/or traction force in a simple manner. In particular, a reliability of the deformation unit can be improved. Especially preferentially the mechanism comprises at least one adjustment element for an adjustment of a pressure force and/or traction force applied at the shape-memory element. The adjustment element is preferably embodied as an adjusting screw. In particular in case of an embodiment as an adjusting screw, the adjustment element is rotatably supported on at least one thread and is at least coupled with the magnetic shape-memory element, preferably arranged in a directly acting manner on the shape-memory element, in such a way that a turning of the adjustment element applies a pressure force and/or traction force to the magnetic shape-memory element.

Moreover it is proposed that the deformation unit comprises at least one, in particular permanent-magnetic, magnet element. This allows further improving a reliability. In particular for this case, the magnet unit and the deformation unit may be realized at least partly integrally.

It is further proposed that a magnetic field main axis of a magnetic field provided by the deformation unit is oriented at least substantially parallel to the transport direction. In this way an especially strong pressure force and/or traction force can be generated.

Beyond this it is proposed that the positive-displacement pump device comprises at least one magnet unit, in particular the afore-mentioned magnet unit, which is configured for moving at least the first partial region along the transport direction. The magnet unit in particular provides a magnetic field which is movable along the transport direction, preferably for generating a movement of the first partial region. The magnet unit may be implemented as a permanent-magnetic magnet unit, which preferably comprises at least one permanent-magnetic magnet element that is supported movably along the transport direction, for the purpose of thus moving the magnetic field along the transport direction. For moving the permanent-magnetic magnet element the positive-displacement pump device could, for example, comprise an actor, e.g. a magnet actor, which is preferably embodied as a linear motor. Preferentially the magnet unit is implemented as an electromagnetic magnet unit comprising a plurality of electromagnetic magnet elements, which are arranged separately along the transport direction and which can be actuated separately and can be activated cascade-wise in the transport direction, for generating a magnetic field moving along the transport direction. In particular, "a movement of a first partial region" is to mean at least one at least partial conversion, preferably several conversions, of at least one second partial region into at least a portion of a first partial region, resulting in an, in particular entire, movement of the first partial region. By "moved" is to be understood that at least one second partial region is at least partly converted into a first partial region and/or vice versa. If in particular the first partial region is situated in a proximity of a respective activated magnet element of the magnet unit, a magnetic field is applied to said partial region. In particular as the magnetic orientation of the first partial region is preferably oriented at least substantially perpendicularly to the magnetic field main axis of the magnetic field created by the magnet unit, the magnetic anisotropy of the first partial region is re-oriented in the proximity of the magnet element. As in particular the structural anisotropy and the magnetic anisotropy are mutually dependent on each other, this preferably also results in a change in the structural anisotropy. For example, in the proximity of the external magnetic field, at least a portion of the first partial region is therefore converted into a new second partial region. In particular as the shape-memory element is deformed by the deformation unit at least in the idle state and preferably permanently, a structural and/or magnetic anisotropy of a second partial region, which is preferably adjacent to the first partial region, must get at least partially spatially and/or magnetically re-oriented outside the proximity of the external magnetic field for maintaining the deformation of the shape-memory element induced by the deformation unit via the pressure force and/or traction force. This means that in particular, outside the proximity of the external magnetic field generated by the respective magnet element, the second partial region is at least partly converted into a first partial region. All in all, in the proximity of the external magnetic field the first partial region advantageously avoids the external magnetic field and moves along the transport direction. After this it is in particular possible for the respective magnet element which was originally situated in the proximity of the first partial region to be deactivated.

In particular for the purpose of further reducing a construction space, it is proposed that the magnet unit, in particular the aforementioned permanent-magnetic magnet unit and/or electromagnetic magnet unit, is arranged at least partly, preferably at least to a large extent and particularly preferably completely coaxially around the shape-memory unit. In particular, a symmetry axis and/or a main extension direction of the magnet unit and of the shape-memory unit are identical. Especially preferentially the magnet unit is arranged at least partly, preferably at least to a large extent and particularly preferably completely coaxially around the deformation unit. In particular, a symmetry axis and/or a main extension direction of the magnet unit and of the deformation unit are identical.

Beyond this it is proposed that the magnet unit, in particular the aforementioned electromagnetic magnet unit, comprises at least one magnet element that is realized as an electromagnetic magnet element.

It is furthermore proposed that the magnet unit, in particular the aforementioned permanent-magnetic magnet unit, comprises at least one first magnet element and at least one second magnet element, which are arranged offset from one another along a transport direction. This advantageously enables different partial sections of the shape-memory element being selectively subjected to a magnetic field.

Moreover it is proposed that the magnet unit comprises at least one first magnet element and a second magnet element, which are actuatable separately from one another. In this way a transport along the transport direction is achievable by an actuation of the magnet elements. Preferentially the magnet elements are realized as separately embodied electromagnetic magnet elements, like for example as coils which, for a separate actuation, can be respectively actuated with a separate current and/or a separate voltage. In particular, the positive-displacement pump device comprises at least one control unit. A "control unit" is in particular to mean a unit with at least one electronic controlling apparatus. An electronic "controlling apparatus" is in particular to mean a unit with a processor unit and with a memory unit and with an operation program that is stored in the memory unit. Principally the control and/or regulation unit may comprise a plurality of interconnected controlling apparatuses, which are preferably configured to communicate with one another via a bus system, in particular a CAN bus system. The control unit is in particular configured for an actuation of the magnet unit and in particular for a separate actuation of the respective magnet element of the magnet unit. For example, individual magnet elements may be arranged along the transport direction and may be consecutively activated and deactivated, as a result of which said magnet elements move at least the first partial region along the transport direction.

It is further proposed that the positive-displacement pump device comprises at least one further magnet unit. This advantageously allows further improvement of an actuation. It is conceivable that the further magnet unit is implemented differently than the magnet unit. It is also conceivable that the magnet unit is realized as a permanent-magnetic magnet unit while the further magnet unit is realized as an electromagnetic magnet unit. For example, the magnet unit, which is in particular realized as a permanent-magnetic magnet unit, could be implemented at least partly, preferably at least to a large extent and particularly preferably completely integrally with the deformation unit and/or could form the deformation unit. However, preferentially at least one of the magnet units is always realized as an electromagnetic magnet unit. Especially preferentially the magnet unit and the further magnet unit are realized as electromagnetic magnet units.

Furthermore it is proposed that the further magnet unit is arranged at least partly offset relative to the magnet unit along the transport direction. This advantageously allows improving a resolution of an actuation, thus ensuring enhanced continuity of the transport operation. In particular, at least one magnet element of the magnet unit is arranged offset along the transport direction relative to the at least one magnet element of the further magnet unit. Preferentially the magnet elements of the magnet unit and the further magnet unit are arranged alternatingly offset relative to one another along the transport direction. In particular viewed perpendicularly to a transport direction, at least one magnet element of the magnet unit is arranged overlapping with at least one magnet element of the further magnet unit.

For the purpose of in particular further improving a compactness of construction, it is moreover proposed that the further magnet unit is arranged at least partly coaxially around the magnet unit. In particular, a symmetry axis and/or a main extension direction and/or a magnetic field main direction of the magnet unit and the further magnet unit are identical.

It is also proposed that the positive-displacement pump device comprises at least one amplification unit, which is configured for amplifying a magnetic field provided by the deformation unit and/or the magnet unit. This allows improvement of an introduction of a magnetic field into the shape-memory unit. The amplification unit in particular comprises at least one yoke. The yoke in particular forms at least partly, preferably at least to a large extent, a magnetic circle. The yoke may herein in particular be implemented of a ferromagnetic material, e.g. iron. Alternatively or additionally the amplification unit may at least partly form the deformation unit and/or may be realized at least partly integrally with the deformation unit. For this purpose, the amplification unit may, for example, in particular comprise at least one permanent-magnetic magnet element.

To achieve an especially compact arrangement of structural components, it is proposed that the amplification unit is arranged such that it at least partially encompasses at least the magnet unit and/or the deformation unit. By an "amplification unit" is in particular a unit to be understood which comprises at least one magnetic circuit which is configured for conducting a magnetic field. The amplification unit is in particular implemented at least partly, preferably at least to a large extent and particularly preferably completely coaxially around the shape-memory unit, the magnet unit, the further magnet unit and/or the deformation unit. In particular, symmetry axes and/or a main extension direction of the amplification unit and the shape-memory unit, the magnet unit, the further magnet unit and/or the deformation unit are identical. Preferentially the amplification unit is arranged at least partly mirror-symmetrically to the main extension axis of the shape-memory unit. Preferably the amplification unit comprises two magnetic circuits, which are preferentially implemented at least substantially identically to each other. The magnetic circuits are arranged mirror-symmetrically to each other around an axis which is identical to the main extension direction of the shape-memory unit. The magnetic circuit in particular comprises at least one yoke. The yoke has a U-shape. The yoke is implemented at least partially of a magnetically conductive material, e.g. iron. It is further conceivable that the yoke is implemented at least partially of a permanent-magnetic material. Preferably the magnetic circuit comprises at least one magnet element. Such a magnet element of the magnetic circuit could be embodied as an electromagnetic magnet element. Preferentially, however, a magnet element of the magnetic circuit is embodied as a permanent-magnetic magnet element. The magnet element herein forms at least one leg of the U-shape of the yoke. The magnetic circuit preferably comprises at least two magnet elements, which are implemented substantially identically to each other. The magnet elements preferentially form two opposite-situated legs of the U-shape. Furthermore the magnetic circuit and/or both of the magnetic circuits are/is implemented at least partly by the shape-memory unit, in particular by the shape-memory element.

Beyond this it is proposed that the positive-displacement pump device comprises at least one compensation unit, which provides at least one magnetic field flowing through the shape-memory unit and comprising a magnetic field main axis that is oriented at least transversely to the transport direction. In this way a magnetic field is achievable which is spread homogeneously in the shape-memory element. "Oriented at least transversely" is in particular to mean oriented at least differently from a parallel orientation. In particular, "oriented at least transversely" is also to mean at least substantially perpendicular. The compensation unit is in particular embodied as a magnet unit, in particular an electromagnetic and/or permanent-magnetic magnet unit. The compensation unit is configured to compensate a magnetic field generated by the magnet unit of the positive-displacement pump device in a movement of the magnetic field along the transport direction, which means in particular in a switching between individual magnet elements of the magnet unit. The compensation unit is preferably actuatable separately from the magnet unit by the control unit. It is conceivable that the magnetic field main axis of the compensation unit is rotatable. This may be enabled, for example, by different magnet elements, in particular electromagnetic magnet elements, which are arranged rotated relative to one another and which are actuatable separately from one another. Alternatively this may be enabled by one magnet element or a plurality of magnet elements, in particular permanent-magnetic magnet element/s, which is/are supported rotatably.

In a further aspect of the invention a method for operating the positive-displacement pump device is proposed, in which a medium is conveyed at least by a magnetic shape-memory element of at least one shape-memory unit at least along at least one transport direction, wherein in at least one method step the magnetic shape-memory element is deformed, at least in an idle state, by a pressure force and/or traction force along the transport direction in such a way that the magnetic shape-memory element comprises at least one first partial region and at least one second partial region, which differ from one another at least by their magnetic orientations. This advantageously allows improving an output of a transport quantity.

In a further aspect of the invention a method for operating the positive-displacement pump device is proposed, wherein the magnetic shape-memory element is subjected to a magnetic field by at least one permanent-magnetic magnet unit such that the magnetic shape-memory element comprises at least one first partial region and at least one second partial region, which differ from one another at least by their magnetic orientations, and that at least the first partial region is moved in a transport direction by at least one electromagnetic magnet unit. This advantageously allows improving an output of a transport quantity.

The positive-displacement pump device according to the invention and/or the method for operating the positive-displacement pump device are herein not to be limited to the application and implementation described above. In particular, for the purpose of fulfilling a functionality that is described here, the positive-displacement pump device according to the invention and/or the method for operating the positive-displacement pump device may comprise a respective number of individual elements, structural components and units as well as method steps that differs from a number mentioned here. Furthermore, in regard to the value ranges given in the present disclosure, values within the limits mentioned shall be considered to be disclosed and to be insertable as applicable.

DRAWINGS

Further advantages will become apparent from the following description of the drawings. In the drawings exemplary embodiments of the invention are illustrated. The drawings, the description and the claims contain a plurality of features in combination. Someone skilled in the art will purposefully also consider the features individually and will find further expedient combinations.

Figure 2:
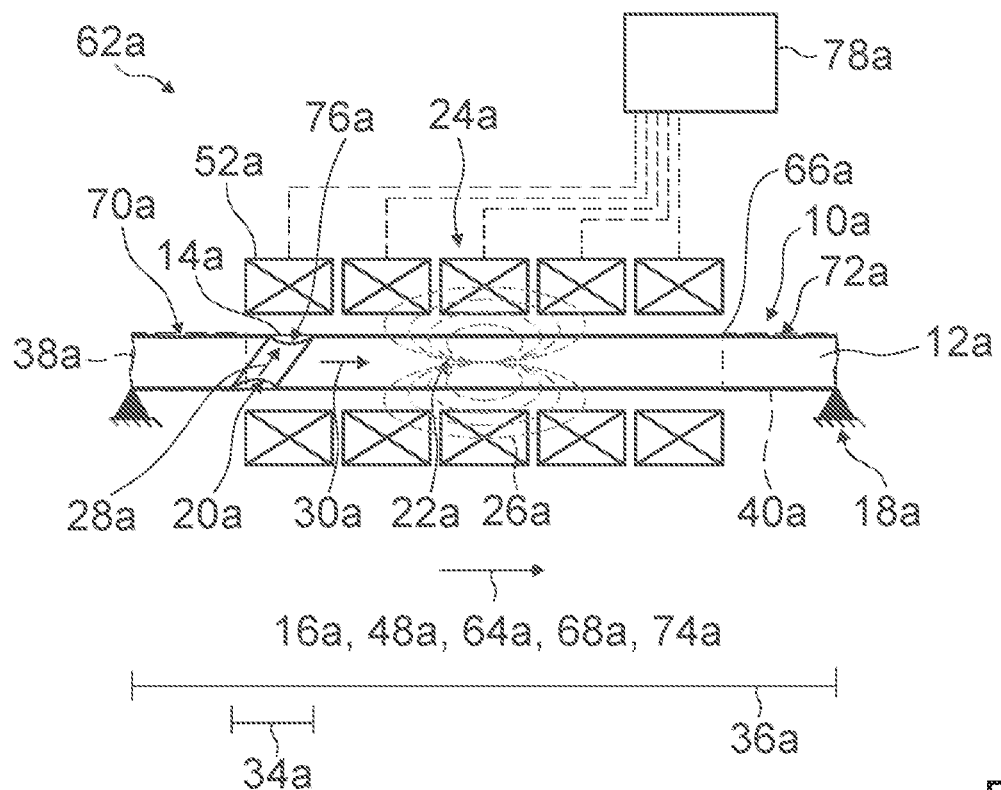
Figure 3:
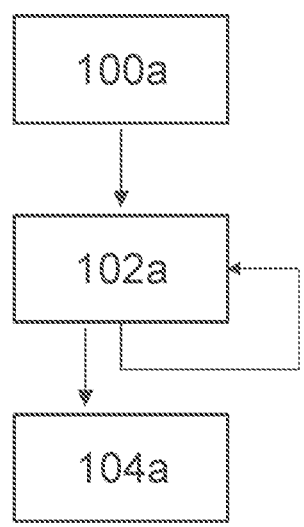
Figure 4:
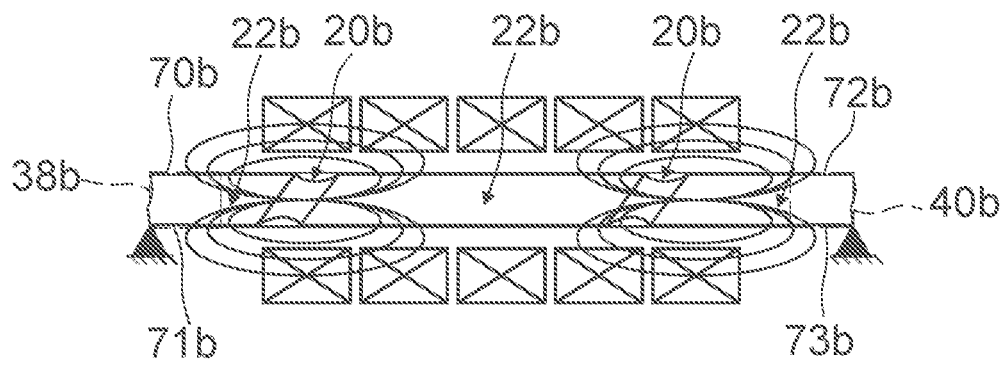
Figure 5:
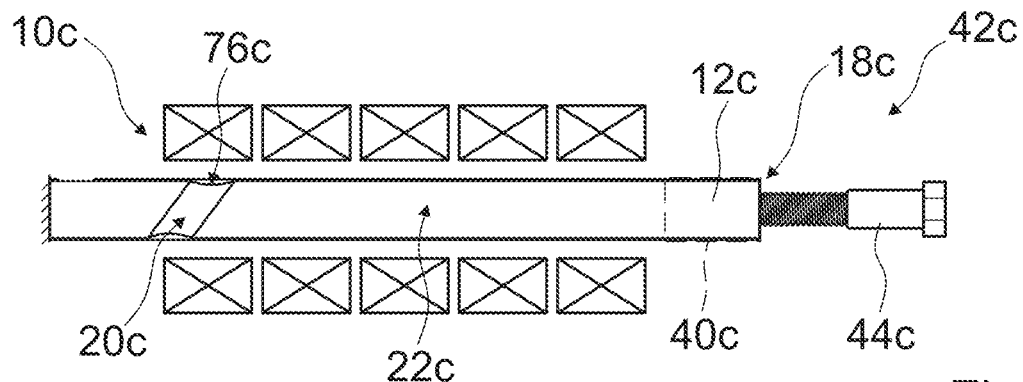
Figure 6:
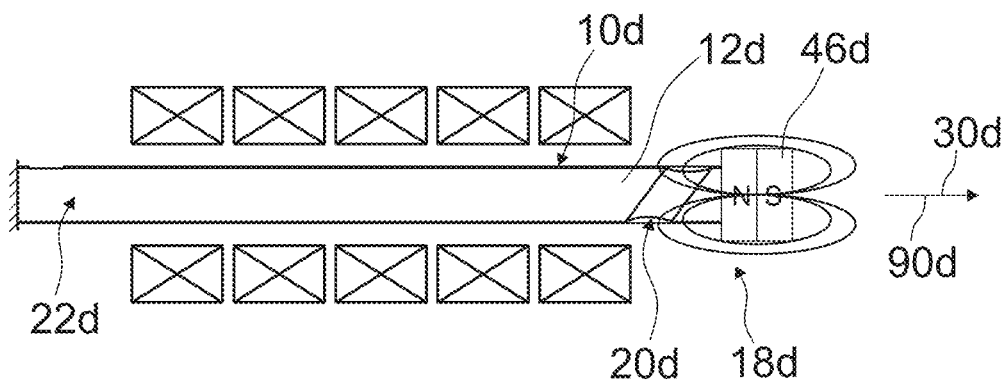

It is shown in:

FIG. 1 a positive-displacement pump with a positive-displacement pump device in a schematic representation, FIG. 2 a portion of the positive-displacement pump device with a shape-memory unit, a deformation unit and a magnet unit in a schematic representation, FIG. 3 a schematic flow chart of a method for operating the positive-displacement pump device, FIG. 4 a further exemplary embodiment of a positive-displacement pump device with a shape-memory unit comprising at least two first partial regions, in a schematic representation, FIG. 5 a further exemplary embodiment of a positive-displacement pump device with a magnet unit and a deformation unit in a schematic representation, FIG. 6 a further exemplary embodiment of a positive-displacement pump device with a magnet unit and a deformation unit in a schematic representation.

Figure 7:
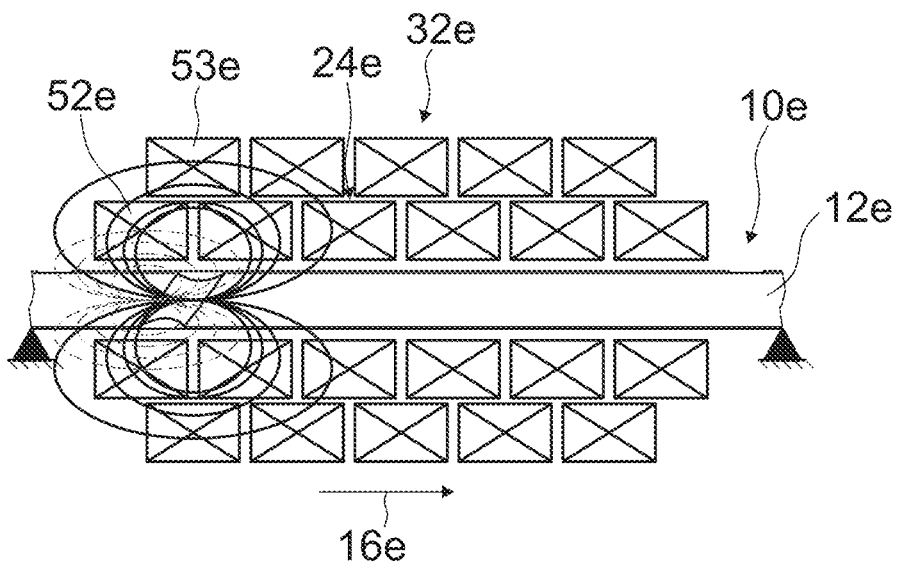
Figure 8:
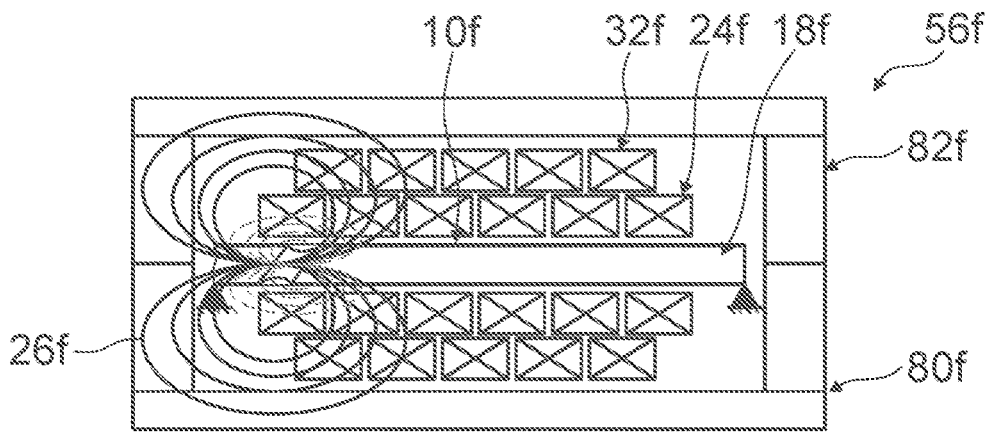
Figure 9:
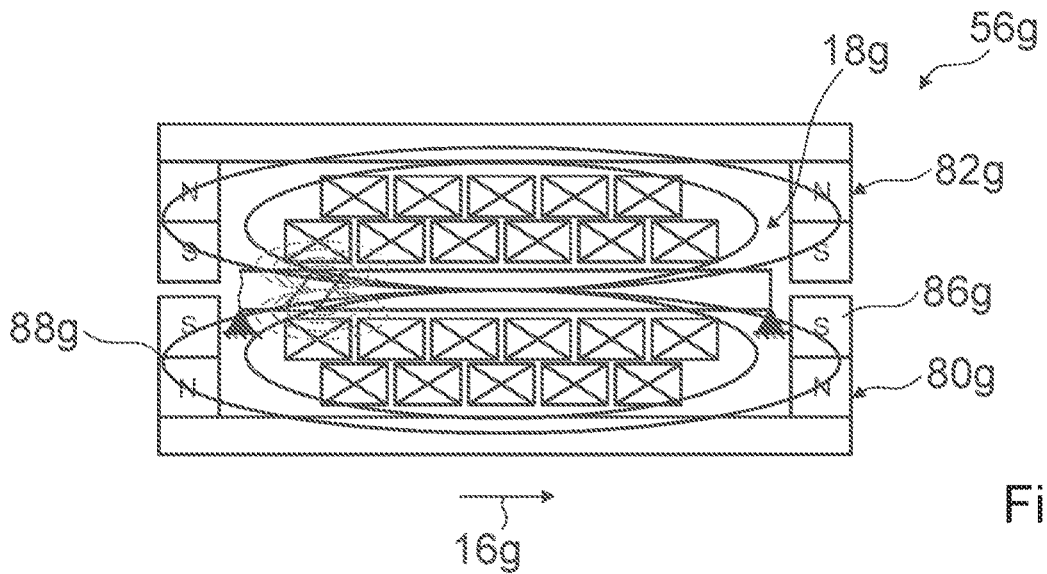

FIG. 7 a further exemplary embodiment of a positive-displacement pump device with a magnet unit and a further magnet unit in a schematic representation, FIG. 8 a further exemplary embodiment of a positive-displacement pump device with an amplification unit, a magnet unit and a further magnet unit in a schematic representation, FIG. 9 a further exemplary embodiment of a positive-displacement pump device with an amplification unit, a magnet unit and a further magnet unit in a schematic representation.

Figure 10:
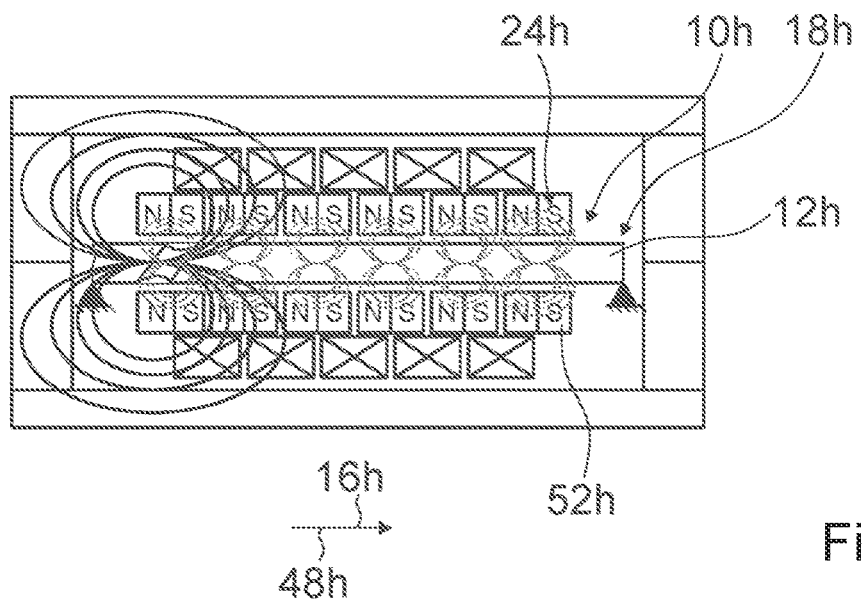
Figure 11:
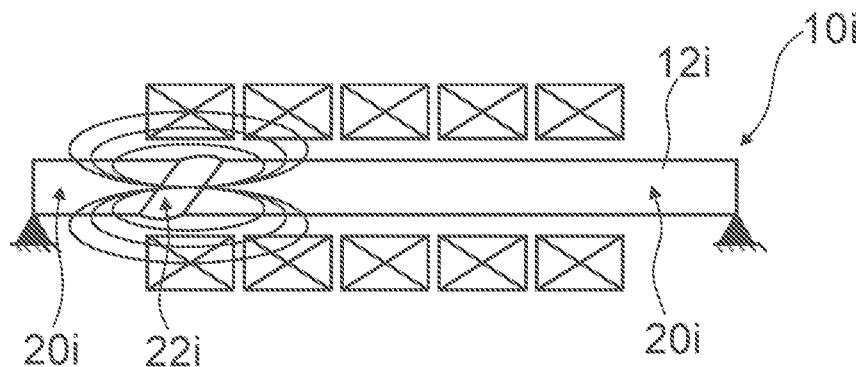

FIG. 10 a further exemplary embodiment of a positive-displacement pump device with an amplification unit, a magnet unit and a further magnet unit in a schematic representation, FIG. 11 a further exemplary embodiment of a positive-displacement pump device with a shape-memory unit comprising a first partial region that extends over a large portion of the main extension of the shape-memory unit, in a schematic representation.

Figure 12:
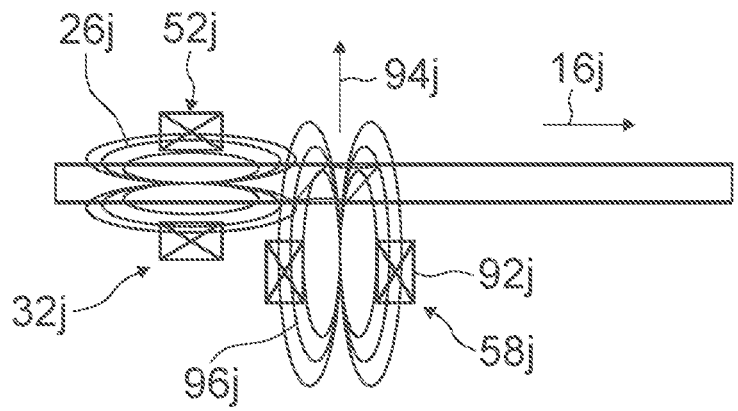
Figure 13:
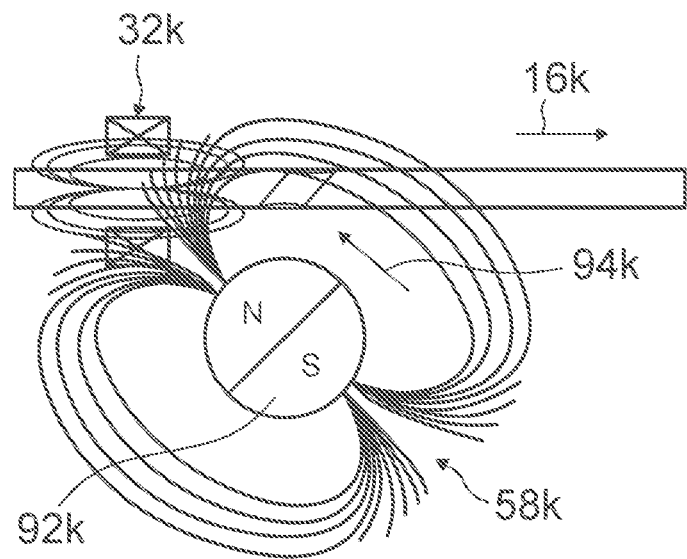
Figure 14:
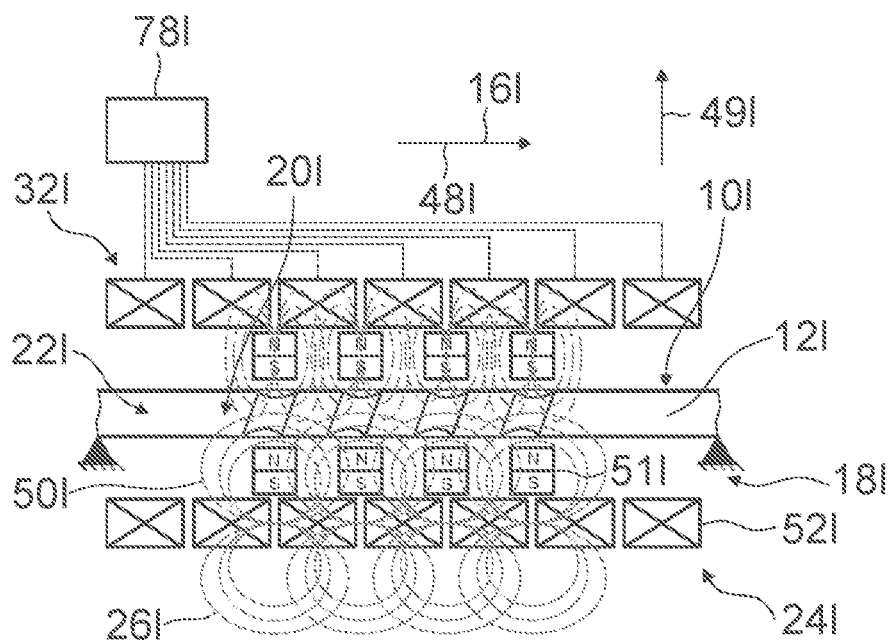

FIG. 12 a further exemplary embodiment of a positive-displacement pump device with a compensation unit in a schematic representation, FIG. 13 a further exemplary embodiment of a positive-displacement pump device with a compensation unit in a schematic representation, and FIG. 14 a further exemplary embodiment of a positive-displacement pump device with a permanent-magnetic magnet unit and an electromagnetic magnet unit in a schematic representation.

DESCRIPTION OF THE EXEMPLARY EMBODIMENTS

FIG. 1 shows a positive-displacement pump 62a with a positive-displacement pump device in a schematic representation. The positive-displacement pump 62a is embodied as a micropump. The positive-displacement pump 62a requires a construction space of maximally 25 cm$^3$. In the present case the positive-displacement pump device completely implements the positive-displacement pump 62a. Alternatively a construction space of the positive-displacement pump 62a could be considerably smaller, with the construction space being preferably no more than 15 cm$^3$ and particularly preferably no more than 5 cm$^3$. A utilization of the positive-displacement pump device in a classical pump, i.e. a pump having a construction space that is larger than 25 cm$^3$, is also conceivable.

The positive-displacement pump device is configured, in an operating state, to convey a medium 14a along a transport direction 16a. In the operating state the positive-displacement pump device uses a current and/or a voltage for a transport of the medium 14a. Furthermore the positive-displacement pump device is configured to store and/or to not convey the medium 14a in an idle state. In the idle state the positive-displacement pump device is free of a current and/or voltage supply.

FIG. 2 shows a portion of the positive-displacement pump device in a schematic representation. The positive-displacement pump device comprises at least one shape-memory unit 10a. The shape-memory unit 10a is configured for the transport of the medium 14a. The shape-memory unit 10a conveys the medium 14a in the transport direction 16a. For the transport of the medium 14a the shape-memory unit 10a makes use of a shape-memory effect. In the present case the shape-memory unit 10a makes use of a magnetic shape-memory effect. Alternatively or additionally a shape-memory unit could also use a different physical shape-memory effect for a transport of a medium, for example a thermal shape-memory effect.

The shape-memory unit 10a is embodied in an elongate manner. The shape-memory unit 10a has a main extension direction 64a. A dimension of the shape-memory unit 10a along the main extension direction 64a equals a main extension of the shape-memory unit 10a. A dimension of the shape-memory unit 10a perpendicularly to the main extension direction 64 is smaller than the main extension of the shape-memory unit 10a at least by a factor of 2. In the present case the dimension perpendicularly to the main extension of the shape-memory unit 10*a* is smaller than the main extension even at least by the factor 10.

The shape-memory unit 10*a* comprises at least one end section 38*a*. The end section 38*a* is arranged on a free end of the shape-memory unit 10*a*. The end section 38*a* extends from a free end of the shape-memory unit 10*a* into the shape-memory unit 10*a*, in particular by maximally 1 cm. In the present case the shape-memory unit 10*a* comprises at least one further end section 40*a*. The further end section 40*a* is implemented at least substantially identically to the end section 38*a*. The further end section 40*a* is arranged on a further free end of the shape-memory unit 10*a*. The further end section 40*a* extends from a further free end of the shape-memory unit 10*a* into the shape-memory unit 10*a*, in particular by maximally 1 cm. The end sections 38*a*, 40*a* are situated opposite each other.

The shape-memory unit 10*a* comprises at least one envelope 66*a*. The envelope 66*a* is configured for an arrangement and/or for a fluid-technical sealing of at least one shape-memory element 12*a*. The envelope 66*a* is implemented in an elongate manner. The envelope 66*a* is in the present case implemented in a flexible-tube shape. The envelope 66*a* has a main extension direction 68*a*. A dimension of the envelope 66*a* along the main extension direction 68*a* equals a main extension of the envelope 66*a*. A dimension of the envelope 66*a* perpendicularly to the main extension direction 68*a* of the envelope 66*a* is smaller than the main extension of the envelope 66*a* at least by a factor of 2. In the present case the dimension perpendicularly to the main extension direction 68*a* of the envelope 66*a* is smaller than its main extension even at least by the factor 10. The main extension of the envelope 66*a* corresponds at least substantially to the main extension of the shape-memory unit 10*a*. The main extension direction 68*a* of the envelope 66*a* is in the present case identical to the main extension direction 64*a* of the shape-memory unit 10*a*. The main extension direction 68*a* of the envelope 66*a* is at least substantially parallel to the transport direction 16*a*.

The envelope 66*a* has a quadrangular cross section (not shown) perpendicularly to its main extension direction 68*a*. The envelope 66*a* comprises four side surfaces. The envelope 66*a* is implemented to be at least partially deformable plastically or elastically. The envelope 66*a* is at least partly implemented of a synthetic material.

For an exchange of the medium 14*a* the shape-memory unit 10*a* comprises at least one medium pass-through 70*a*. The medium pass-through 70*a* is formed by a recess of the envelope 66*a*. In the present case the shape-memory unit 10*a* comprises a further medium pass-through 72*a*. The further medium pass-through 72*a* is implemented at least substantially identically to the medium pass-through 70*a*. The medium pass-through 70*a* and the further medium pass-through 72*a* are arranged offset relative to each other along the transport direction 16*a*. The medium pass-through 70*a* and the further medium pass-through 72*a* are arranged on a same side of the shape-memory unit 10*a*. The medium pass-through 70*a* is arranged in the end section 38*a*. The medium pass-through 70*a* is realized as a medium inlet. The further medium pass-through 72*a* is arranged in the end section 40*a*. The further medium pass-through 72*a* is realized as a medium outlet. Alternatively or additionally a shape-memory unit could comprise additional medium pass-throughs, which could in particular be arranged on different, preferably opposite-situated, sides relative to the arrangement of the already mentioned medium pass-throughs, as a result of which a pressure-compensated pump mechanism would be achievable.

The shape-memory unit 10*a* comprises at least one shape-memory element 12*a*. In the present case the shape-memory unit 10*a* comprises exactly one shape-memory element 12*a*. Alternatively it is however conceivable that a shape-memory unit could comprise at least two or a plurality of shape-memory elements which are embodied separately and/or coupled with each other, as a result of which larger transport volumes could be realized. It would also be possible that a plurality of sub-shape-memory elements form a shape-memory element.

The shape-memory element 12*a* is embodied in an elongate manner. The shape-memory element 12*a* has a main extension direction 74*a*. A dimension of the shape-memory element 12*a* along the main extension direction 74*a* is equivalent to a main extension of the shape-memory element 12*a*. A dimension of the shape-memory element 12*a* perpendicularly to the main extension direction 74*a* is smaller than the main extension of the shape-memory element 12*a* at least by a factor of 2. In the present case the dimension perpendicularly to the main extension direction 74*a* of the shape-memory element 12*a* is smaller than the main extension even at least by a factor 10. The main extension of the shape-memory element 12*a* at least substantially corresponds to the main extension of the shape-memory unit 10*a*. The main extension direction 74*a* of the shape-memory element 12*a* is identical to the main extension direction 68*a* of the envelope 66*a* and/or to the main extension direction 64*a* of the shape-memory unit 10*a*. The main extension direction 74*a* of the shape-memory element 12*a* is at least substantially parallel to the transport direction 16*a*.

The shape-memory element 12*a* has a rod shape. The shape-memory element 12*a* has a quadrangular cross section (not shown) perpendicularly to the transport direction 16*a*. Alternatively the shape-memory element could have a rectangular or a circular cross section. The shape-memory element 12*a* is arranged in the envelope 66*a*. The envelope 66*a* encloses the shape-memory element 12*a* from four sides. The envelope 66*a* seals the shape-memory element 12*a* off, preferably at least between the end sections 38*a*, 40*a*.

The shape-memory element 12*a* is in the present case realized as a magnetic shape-memory element. The shape-memory element 12*a* is formed at least partly of a shape-memory material. The shape-memory material is a magnetically effective and/or active shape-memory material. The shape-memory material is a magnetic shape-memory alloy (also known as an MSM material=Magnetic Shape Memory). The shape-memory material herein comprises nickel, manganese and gallium. Alternatively the shape-memory material could also be a magneto-strictive material.

The shape-memory material has a structural anisotropy. The shape-memory material furthermore has a magnetic anisotropy. The structural anisotropy and the magnetic anisotropy are mutually dependent on each other. A deformation of the shape-memory element 12*a* comprising the shape-memory material can be compensated at least by a structural re-orientation of the structural anisotropy and leads to an at least substantially equivalently corresponding re-orientation of a magnetic orientation of the magnetic anisotropy. The other way round, an external magnetic field acting onto the shape-memory element 12*a* comprising the shape-memory material can be compensated by at least one section-wise magnetic re-orientation of the magnetic anisotropy, resulting in an at least substantially equivalently corresponding re-orientation of a structural orientation of the structural anisotropy.

A pressure force and/or traction force acting onto the shape-memory element 12*a* at least in an idle state of the positive-displacement pump device leads to an implementation of at least two different partial regions 20*a*, 22*a* of the shape-memory element 12*a*, namely a first partial region 20*a* and at least one second partial region 22*a*. Herein the partial regions 20*a*, 22*a* differ from each other by their respective structural orientations of the structural anisotropy and/or magnetic orientations of the magnetic anisotropy. Furthermore, such a permanent deformation and/or an acting external magnetic field may result in a permanent implementation of the partial regions 20*a*, 22*a*.

For a deformation of the shape-memory element 12*a* at least in the idle state and in particular for a permanent deformation, the positive-displacement pump device comprises at least one deformation unit 18*a*. The deformation unit 18*a* is configured, at least in an idle state, to deform the magnetic shape-memory element 12*a* by a pressure force and/or traction force for the purpose of providing a transport volume 76*a*. The pressure force and/or traction force is herein directed in the transport direction 16*a*.

In the present case the deformation unit 18*a* is arranged on the end sections 38*a*, 40*a* of the shape-memory unit 10*a*. The deformation unit 18*a* forms a support for the shape-memory unit 10*a*. The deformation unit 18*a*, in particular permanently, tensions and/or expands the shape-memory unit 10*a*, such that a pressure force and/or traction are/is exerted on the shape-memory element 12*a* at least in the idle state and preferably permanently.

A deformation degree of the shape-memory element 12*a*, and thus a transport volume 76*a* provided, is correlated with the strength of the pressure force and/or of the traction force. The deformation degree of the resulting deformation is adjustable via the strength of the pressure force and/or traction force.

Alternatively or additionally further implementations of the deformation unit are conceivable wherein, for example, by an implementation of the deformation unit as a magnet unit an external magnetic field may be used for the deformation, in particular for generating a pressure force and/or traction force. For this case a deformation degree of a shape-memory element would be correlated with the strength of the magnetic field and/or in particular the strength of a pressure force and/or traction force generated by the magnetic field and acting onto the shape-memory element.

By the deformation of the shape-memory element 12*a* by the deformation unit 18*a* at least two partial regions 20*a*, 22*a* are created. The magnetic shape-memory element 12*a* comprises at least the first partial region 20*a*. The first partial region 20*a* has a first dimension perpendicularly to the transport direction 16*a*. The magnetic shape-memory element 12*a* comprises at least one second partial region 22*a*. The second partial region 22*a* has a second dimension perpendicularly to the transport direction 16*a*. The first dimension of the first partial region 20*a* perpendicularly to the transport direction 16*a* is smaller than the second dimension of the second partial region 22*a* perpendicularly to the transport direction 16*a*. The first partial region 20*a* extends over a small fraction 34*a* of an extension 36*a* of the magnetic shape-memory element 12*a* along the transport direction 16*a*. In the present case the first partial region 20*a* extends over maximally 25% of the main extension of the shape-memory element 12*a*. The second partial region 22*a* extends over a large portion of an extension of the magnetic shape-memory element 12*a* in the transport direction 16*a*. In the present case the second partial region 22*a* extends over at least 50% of the main extension of the shape-memory element 12*a*. The first partial region 20*a* and the second partial region 22*a* hence differ from each other at least by their respective dimensions and/or extensions.

The first partial region 20*a* and the envelope 66*a* enclose a transport volume 76*a*, which is configured for the transport of the medium 14*a*. The first partial region 20*a* and the second partial region 22*a* are arranged neighboring each other. The transport volume 76*a* thus results from the different dimensions of the first partial region 20*a* in comparison to the second partial region 22*a* perpendicularly to the transport direction 16*a*. In the present case the shape-memory element 12*a* comprises two second partial regions 22*a*, which delimit the first partial region 20*a*, in particular the transport volume 76*a* provided by the first partial region 20*a*. Depending on an implementation and in particular on a transport performance of the positive-displacement pump device, implementations with a plurality of first and second partial regions are conceivable.

The first partial region 20*a* has a first magnetic orientation 28*a*. The second partial region 22*a* has a second magnetic orientation 30*a*. The first magnetic orientation 28*a* of the first partial region 20*a* and the second magnetic orientation 30*a* of the second partial region 22*a* differ from each other. The first magnetic orientation 28*a* of the first partial region 20*a* is in the present case at least substantially perpendicular to the transport direction 16*a*. The second magnetic orientation 30*a* of the second partial region 22*a* is in the present case at least substantially parallel to the transport direction 16*a*. The first magnetic orientation 28*a* of the first partial region 20*a* is at least substantially perpendicular to the second magnetic orientation 30*a* of the second partial region 22*a*. The first partial region 20*a* and the second partial region 22*a* hence differ from each other at least by their respective magnetic orientations 28*a*, 30*a*.

The positive-displacement pump device comprises at least one magnet unit 24*a*. In the present case the magnet unit 24*a* is configured to move the first partial region 20*a* along the transport direction 16*a*. The magnet unit 24*a* is configured to provide an external magnetic field 26*a*, which is movable along the transport direction 16*a*. In an operating state of the positive-displacement pump device the magnet unit 24*a* subjects the shape-memory unit 10*a*, in particular the shape-memory element 12*a* of the shape-memory unit 10*a*, to the external magnetic field 26*a*. Alternatively or additionally the positive-displacement pump device may comprise further magnet units. For example, a further magnet unit could at least partly realize a deformation unit and/or could be realized at least partly integrally with a deformation unit. It is moreover conceivable that a further magnet unit could be configured for permanent magnetic re-orientation of the magnetic orientations of the partial regions.

A magnetic field main axis 48*a* of the external magnetic field 26*a* of the magnet unit 24*a* is at least substantially parallel to the transport direction 16*a*. The magnetic field main axis 48*a* of the external magnetic field 26*a* is at least substantially perpendicular to the first magnetic orientation 28*a* of the first partial region 20*a*. The magnetic field main axis 48*a* of the external magnetic field 26*a* is at least substantially parallel to the second magnetic orientation 30*a* of the second partial region 22*a*. It is furthermore conceivable that a main axis of a further magnetic field may also be at least substantially parallel to the transport direction, in particular for the case that the further magnet unit at least partly realizes a deformation unit and/or is realized at least partly integrally with a deformation unit. Moreover a further magnet unit, which is configured for a magnetic re-orientation of the partial regions, could have a magnetic field main axis that is oriented at least substantially perpendicularly to the transport direction.

The magnet unit 24a extends along the transport direction 16a at least substantially in parallel to the shape-memory unit 10a. The magnet unit 24a is arranged coaxially around the magnetic shape-memory element 12a. A symmetry axis and/or a main extension direction of the shape-memory unit 10a, in particular of the shape-memory element 12a and of the magnet unit 24a, is identical. Alternatively or additionally the magnet unit and/or further magnet units could be arranged at least partly coaxially around a deformation unit or further components of the positive-displacement pump device.

The magnet unit 24a comprises at least one magnet element 52a. The magnet element 52a is arranged coaxially around the shape-memory unit 10a. The magnet element 52a is realized as an electromagnetic magnet element 52a. In the present case the magnet element 52a is realized as an air-core coil. A symmetry axis of the magnet element 52a is at least substantially parallel to the transport direction 16a. The symmetry axis of the magnet element 52a defines the magnetic field main axis 48a of the external magnetic field 26a.

In the present case the magnet unit 24a comprises five magnet elements 52a. The magnet elements 52a are embodied at least substantially identically to one another. The magnet elements 52a are arranged along the transport direction 16a relative to each other. The magnet unit 24a is in the present case free of magnet elements which are embodied in a permanent-magnetic manner. The present magnet unit 24a hence is an electromagnetic magnet unit. However, alternatively or additionally a magnet unit could comprise at least one permanent-magnetic magnet element.

The magnet elements 52a are actuatable separately from each other. For the purpose of moving the external magnetic field 26a of the magnet unit 24a along the transport direction 16a, the magnet elements 52a are actuatable one by one cascade-wise in the transport direction 16a. A number of magnet elements may herein differ from a number depicted in the present exemplary embodiment and may in particular depend on a dimensioning of the magnet elements and/or a dimensioning of the shape-memory unit. Alternatively or additionally it is conceivable that, in particular in an implementation of the magnet unit as a permanent-magnetic magnet unit, the magnetic field could be displaceable via actuatory movement of the magnet elements.

The positive-displacement pump device comprises at least one control unit 78a. The control unit 78a is configured at least for an actuation of the magnet unit 24a. The control unit 78a is configured at least for a separate actuation of the magnet elements 52a of the magnet unit 24a. It is conceivable that the control unit uses at least one transport quantity that is predetermined or predeterminable by an operator as at least one control parameter. Furthermore, the control units could be configured for a controlling of further components of the positive-displacement pump device. For example, the deformation unit could be actuatable, in particular for an adjustment of a deformation degree correlated with the transport volume 76a.

In FIG. 3 a schematic method flow of a method for operating the positive-displacement pump device is illustrated. The method and in particular the method steps 100a, 102a, 104a contained in the method are stored in the control unit 78a and/or are executable with the control unit 78a.

The method comprises a first method step 100a. The shape-memory element 12a comprises an original second partial region 22a. The original second partial region 22a extends over the entire main extension of the shape-memory element 12a. In the method step 100a a pressure force and/or traction force is exerted onto the shape-memory unit 10a in the transport direction 16a by the deformation unit 18a. The shape-memory unit 10a is deformed by the deformation unit 18a in an idle state and in particular permanently and thus has a deformation. The shape-memory element 12a of the shape-memory unit 10a is deformed by an at least partial re-orientation of its structural anisotropy. As the structural anisotropy and the magnetic anisotropy are mutually dependent on each other, the magnetic anisotropy is partially re-organized equivalently. In this way at least a portion of the original second partial region 22a is converted into a first partial region 20a. The original second partial region 22a is divided into a first partial region 20a and two second partial regions 22a. Between the envelope 66a and the first partial region 20a a transport volume 76a is created, which is delimited by the neighboring second partial region 22a. In the present case the pressure force and/or traction force are/is applied by a clamping-in of the shape-memory unit 10a in the support formed by the deformation unit 18a. This may be realized, for example, during production and/or assembly of the positive-displacement pump device. Beyond this it is conceivable that a deformation degree is adjustable via a more strongly acting pressure force and/or traction force acting onto the shape-memory element 12a. It is conceivable, for example, that this is achieved by means of a mechanism comprising, for example, an adjusting screw which the shape-memory unit is coupled with. In particular for the case of the deformation unit being implemented at least partly by a magnet unit and/or being realized at least partly integrally with a magnet unit, the deformation degree is adjustable via a magnetic field intensity of a magnetic field provided for the deformation of the shape-memory element. It is also conceivable that several first partial regions are formed to compensate the deformation. However, to achieve the formation of one single first partial region, the magnet unit, in particular all magnet elements of the magnet unit, can be activated simultaneously so as to unite the first partial regions into one single first partial region.

The method comprises at least one further method step 102a. The further method step 102a may be carried out after the method step 100a. For the case that the positive-displacement pump device has already been manufactured and/or is already in operation, it is possible to dispense with the method step 100a, and in particular to start the method with the further method step 102a and/or to carry out the further method step 102a repeatedly. To provide the external magnetic field 26a, the control unit 78a activates at least one magnet element 52a that is situated in a proximity of the first partial region 20a. The respective magnet element 52a subjects the first partial region 20a to the external magnetic field 26a. As the magnetic orientation 28a of the first partial region 20a is oriented at least substantially perpendicularly to the magnetic field main axis 48a of the external magnetic field 26a, the magnetic anisotropy of the first partial region 20a is re-oriented in the proximity of the activated magnet element 52a. Due to the structural anisotropy and the magnetic anisotropy being mutually dependent on each other, the structural anisotropy also changes herewith. In the proximity of the magnet element 52a thus at least a portion of the first partial region 20a is converted into a new second partial region 22a. As the shape-memory element 12a is permanently deformed by the deformation unit 18a, the anisotropy of the second partial region 22a neighboring the first partial region 20a must be at least partly re-oriented spatially and/or magnetically outside the proximity of the magnet element 52a so as to further maintain the deformation of the shape-memory element 12a induced by the deformation unit 18a. Outside the proximity of the activated magnet element 52a the second partial region 22a is hence converted into a new first partial region 20a. All in all, the first partial region 20a thus avoids the activated magnet element 52a in the proximity of the activated magnet element 52a and is displaced along the transport direction 16a. Then it is possible that the respective magnet element 52a which had originally been in the proximity of the first partial region 20a to be deactivated.

The method step 102a is repeated for each magnet element 52a of the magnet unit 24a. By a cascade-wise actuation and in particular activation of the magnet elements 52a of the magnet unit 24a, which are arranged offset from one another along the transport direction 16a, it is thus achievable that the first partial region 20a moves along the transport direction 16a. The method step 16a is repeated until the transport volume 76a has been conveyed from the end section 38a to the end section 40a.

The method comprises at least one further method step 104a. In the method step 104a a transport of the medium 14a is terminated in particular after reaching an intended transport quantity. The transport is terminated by deactivation of the magnet unit 24a. Due to the deformation of the shape-memory unit 10a effected by the deformation unit 18a at least in the idle state, preferably permanently, a possible residue of the medium 14a may be stored in a first partial region 20a within the shape-memory unit 10a.

FIGS. 4 to 14 show further exemplary embodiments of the invention. The following descriptions are substantially limited to the differences between the exemplary embodiments, wherein regarding structural components, features and functions which remain the same, the description of the exemplary embodiment of FIGS. 1 to 3, and in particular the description of the respectively preceding exemplary embodiments, may be referred to. To distinguish between the exemplary embodiments the letter a added to the reference numerals of the exemplary embodiment of FIGS. 1 to 3 has been substituted by the letters b to l in the reference numerals of the exemplary embodiments of FIGS. 4 to 14. In regard to structural components having the same denomination, in particular in regard to structural components with the same reference numerals, principally the drawings and/or the description of the exemplary embodiment of FIGS. 1 to 3, and in particular of the respectively preceding exemplary embodiments, may principally be referred to.

FIG. 4 shows a further exemplary embodiment of the positive-displacement pump device in a schematic representation. This exemplary embodiment is distinguished by an actuation of a magnet unit 24b, a number of partial regions 20b, 22b and/or a number of medium pass-throughs 70b, 72b of the positive-displacement pump device.

In the present case the shape-memory element 12b comprises two first partial regions 20b. Furthermore the shape-memory element 12b comprises three second partial regions 22b. For a simultaneous movement of the two first partial regions 20b respectively two of the magnet elements 52b of the magnet unit 24b are simultaneously activated by the control unit 78b and are in particular actuated cascade-wise in a transport direction 16b.

In the present case the shape-memory unit 10b comprises two medium pass-throughs 70b, 71b in the end section 38b. The medium pass-throughs 70b, 71b are located on opposite-situated sides of the shape-memory unit 10b. The medium pass-throughs 70b, 71b in the end section 38b are implemented as medium inlets. The shape-memory unit 10b moreover comprises two further medium pass-throughs 72b, 73b in the further end section 40b. The further medium pass-throughs 72b, 73b are located on opposite-situated sides. The further medium pass-throughs 72b, 73b in the further end section 40b are implemented as medium outlets.

FIG. 5 shows a further exemplary embodiment of a positive-displacement pump device in a schematic representation. This exemplary embodiment is distinguished essentially by an implementation of a deformation unit 18c of the positive-displacement pump device. In the present case the deformation unit 18c comprises at least one mechanism 42c. The mechanism 42c is configured for a mechanical deformation of the magnetic shape-memory element 12c of the shape-memory unit 10c of the positive-displacement pump device. By means of the mechanism 42c it is possible for the shape-memory element 12c to be subjected to a pressure force or a traction force. The mechanism 42c is arranged on a further end section 40c of the shape-memory unit 10c. The mechanism 42c comprises at least one adjusting screw 44c. A pressure force and/or traction force applied to the shape-memory element 12c by the deformation unit 18c is adjustable by means of the adjusting screw 44c. This means that a deformation degree of the shape-memory element 12c is adjustable via the deformation unit 18c. Via the deformation degree a transport volume 76c between the first partial region 20c of the shape-memory element 12c and an envelope 66c of the shape-memory unit 10c is adjustable.

FIG. 6 shows a further exemplary embodiment of a positive-displacement pump device in a schematic representation. This exemplary embodiment is distinguished essentially by an implementation of a deformation unit 18d of the positive-displacement pump device.

In the present case the deformation unit 18d is implemented as a magnet unit. The deformation unit 18d comprises at least one magnet element 46d. The magnet element 46d interacts with a shape-memory element 12d of the shape-memory unit 10d of the positive-displacement pump device, in particular with a second partial region 22d of the shape-memory element 12d, which has a same magnetic orientation 30d as a magnetic field main axis 90d of the magnet element 46d. The shape-memory element 12d is hence attracted or repulsed by the magnet element 46d. A pressure force or traction force is generated, which the shape-memory element 12d is subjected to by means of the magnet element 46d. The magnet element 46d is arranged on a further end section 40d of the shape-memory unit 10d. Furthermore, respectively one magnet element could be arranged on the two end sections of the shape-memory unit.

In the present case the magnet element 46d is realized as a permanent-magnetic magnet element. It is however conceivable, in particular for the purpose of adjusting a deformation degree, that the magnet element could be realized as an electromagnetic magnet element. As a result, an acting magnetic force, and thus a resulting deformation of the shape-memory element, would be adjustable via a current and/or a voltage applied at the magnet element.

FIG. 7 shows a further exemplary embodiment of a positive-displacement pump device in a schematic representation. This is distinguished essentially by the positive-displacement pump device comprising at least one further magnet unit 32e.

The further magnet unit 32e is implemented at least substantially identically to the magnet unit 24e of the positive-displacement pump device. The further magnet unit 32e is arranged at least partly coaxially around the magnet unit 24e. The further magnet unit 32e is arranged along a transport direction 16e of the positive-displacement pump device at least partly offset relative to the magnet unit 24e. In particular, further magnet elements 53e of the further magnet unit 32e are arranged along the transport direction 16e offset relative to the magnet elements 52e of the magnet unit 24e. A control unit of the positive-displacement pump device alternatingly actuates the magnet units 24e, 32e separately such that the individual magnet elements 52e, 53e of the magnet units 24e, 32e are activated cascade-wise for moving a first partial region of a shape-memory element 12e of the shape-memory unit 10e along the transport direction 16e. In the actuation the control unit takes a mutual induction of the magnet elements 52e, 53e of the magnet units 24e, 32e into account, as a result of which in particular an advantageous energy efficiency is achievable in the actuation of the magnet units 24e, 32e.

FIG. 8 shows a further exemplary embodiment of a positive-displacement pump device in a schematic representation. This is distinguished essentially by the positive-displacement pump device comprising at least one amplification unit 56f.

The amplification unit 56f is configured for a selective introduction of a magnetic field 26f provided by magnet units 24f, 32f of the positive-displacement pump device into a shape-memory unit 10f of the positive-displacement pump device. The amplification unit 56f is arranged in such a way that it at least partially encompasses at least one deformation unit 18f and/or a magnet unit 24f, 32f of the positive-displacement pump device.

The amplification unit 56f is arranged coaxially with the shape-memory unit 10f, the deformation unit 18f, the magnet unit 24f and the further magnet unit 32f. The amplification unit 56f comprises at least one magnetic circuit 80f. The magnetic circuit 80f has a U-shape. The magnetic circuit 80f comprises in the present case three magnetic field elements which form the legs of the U-shape. Alternatively the magnetic circuit could also be implemented in one piece.

In the present case the amplification unit 56f comprises two magnetic circuits 80f, 82f. The magnetic circuits 80f, 82f are implemented at least substantially identically to each other. The magnetic circuits 80f, 82f are arranged mirror-symmetrically to each other around the shape-memory unit 10f. A mirror axis which the magnetic circuits 80f, 82f are mirrored on is identical to a main extension direction of the shape-memory unit 10f.

FIG. 9 shows a further exemplary embodiment of a positive-displacement pump device in a schematic representation. This exemplary embodiment is distinguished essentially by an implementation of an amplification unit 56g of the positive-displacement pump device.

The amplification unit 56g comprises two magnetic circuits 80g, 82g. In the present case the magnetic circuit 80g comprises two magnet elements 86g, 88g. The magnet elements 86g, 88g each form a leg of the magnetic circuit 80g. The magnet elements 86g, 88g are realized as permanent-magnetic magnet elements 86g, 88g. Alternatively these could as well be realized as electromagnetic magnet elements.

The magnet elements 86g, 88g are configured to magnetize the magnetic circuit 80g. The magnet elements 86g, 88g are herein arranged in a proximity of end sections of the shape-memory unit 10g. Magnetic field main axes 87g, 89g of the individual magnet elements 86g, 88g are herein at least substantially perpendicular to the transport direction 16g. In the present case the amplification unit 56g at least partially forms a deformation unit 18g of the positive-displacement pump device as in particular the magnet elements 86g, 88g exert a pressure force and/or traction force onto the shape-memory element 12g of the shape-memory unit 10g.

FIG. 10 shows a further exemplary embodiment of a positive-displacement pump device in a schematic representation. This exemplary embodiment is distinguished essentially by an implementation of a deformation unit 18h of the positive-displacement pump device.

The deformation unit 18h is arranged at least partly coaxially around a shape-memory element 12h of a shape-memory unit 10h of the positive-displacement pump device. In the present case a magnet unit 24h at least partly forms the deformation unit 18h. Magnet elements 52h of the magnet unit 24h are in the present case realized as permanent-magnetic magnet elements 52h. A magnetic field main axis 48h of the magnet elements 52h is at least substantially parallel to the transport direction 16h.

FIG. 11 shows a further exemplary embodiment of a positive-displacement pump device in a schematic representation. This is distinguished essentially by an implementation of first partial regions 20i and second partial regions 22i of a shape-memory element 12i of a shape-memory unit 10i of the positive-displacement pump device.

In the present case the second partial region 22i extends only over a fraction of the extension of the shape-memory element 12i. The first partial region 20i extends over a large portion of the shape-memory element 12i. In the present case the shape-memory element 12i further comprises a second partial region 22i and two first partial regions 20i.

FIG. 12 shows a further exemplary embodiment of the positive-displacement pump device in a schematic representation. This is distinguished essentially by the positive-displacement pump device comprising at least one compensation unit 58j.

The compensation unit 58j is embodied as a magnet unit. The compensation unit 58j may be embodied as an electromagnetic and/or as a permanent-magnetic magnet unit. In the present case the compensation unit 58j is embodied as an electromagnetic magnet unit. The compensation unit 58j is configured to compensate a magnetic field 26j provided by a magnet unit 32j of the positive-displacement pump device during a movement of said magnetic field 26j along the transport direction 16j, for example during a deactivation and activation of different magnet elements 52j of the magnet unit 24j. The compensation unit 58j can be actuated separately by a control unit of the positive-displacement pump device. The compensation unit 58j provides a magnetic field 96j having a magnetic field main axis 94j that is at least transverse, preferably at least substantially perpendicular to the transport direction 16j. The magnetic field 96j hence flows through the shape-memory unit 10j at least partially transversely to the transport direction 16i. It is also conceivable that the magnetic field main axis 94j of the compensation unit 58j is rotatable. This can in particular be achieved by different magnet elements, in particular coils, which are arranged rotated relative to each other and are actuatable separately from each other. It is moreover conceivable that the compensation unit comprises at least one permanent-magnetic magnet element which is itself supported in a rotatable fashion for rotating said magnet element along the transport direction, in particular correspondingly to the movement of the magnetic field of the magnet unit.

FIG. 13 shows a further exemplary embodiment of the positive-displacement pump device in a schematic representation. This is distinguished essentially by an implementation of a compensation unit 58k of the positive-displacement pump device. In the present case the compensation unit 58k is embodied as a permanent-magnetic magnet unit. The compensation unit 58k comprises at least one permanent-magnetic magnet element 92k. The magnet element 92k is supported rotatably. The magnet element 92k is supported rotatably relative to a deformation unit 18k of the positive-displacement pump device. A rotation axis, around which the magnet element 92k is rotatable, is at least substantially perpendicular to a transport direction 16k.

FIG. 14 shows a further exemplary embodiment of a positive-displacement pump device in a schematic representation. This is distinguished essentially by an implementation of a deformation unit 18l of the positive-displacement pump device.

In the present case the deformation unit 18l is realized as an, in particular permanent-magnetic, magnet unit 32l. The deformation unit 18l comprises magnet elements 51l. In the present case the magnet elements 51l are embodied as permanent-magnetic magnet elements 51l. Each of these provides respectively one magnetic field 50l. Alternatively the magnet elements could also be embodied as electromagnetic magnet elements.

A respective magnetic field main axis 49l of the magnetic field 50l of the magnet elements 51l is oriented at least substantially perpendicularly to the transport direction 16l. In this way the magnet elements 51l re-orient an anisotropy of a shape-memory element 12l of a shape-memory unit 10l of the positive-displacement pump device. As a result of this, a plurality of first partial regions 20l are provided. For moving the first partial regions 20l along the transport direction 16l, a magnet unit 24l of the positive-displacement pump device is used. A control unit 78l of the positive-displacement pump device alternatingly actuates electromagnetic magnet elements 52l of the magnet unit 24l cascade-wise, such that a respective electromagnetic magnet element 52l of the magnet unit 24l arranged in a proximity of the magnet element 51l of the deformation unit 18l generates a magnetic field 26l that has a magnetic field main axis 48l parallel to the transport direction 16l. In comparison thereto, outside the proximity a magnetic field main axis 49l is oriented perpendicularly to the transport direction 16l by the magnet unit 24l. By such an actuation it is possible for the first partial region 20l to be partially converted into the second partial region 22l or vice versa, which eventually results in a movement of the first partial regions 20l in the transport direction 16l.

The invention claimed is:

1. A positive-displacement pump device, comprising:
   at least one shape-memory unit, wherein the at least one shape-memory unit comprises at least one magnetic shape-memory element, which is configured to convey at least one medium along at least one transport direction; and
   at least one mechanical deformation unit, which at least in an idle state, in which the positive-displacement pump device is free of a current and/or voltage supply, and that differs from an operation state in which the positive-displacement pump device actively conveys the at least one medium along the at least one transport direction, is configured, specifically designed to permanently mechanically compress the at least one magnetic shape-memory element such that a compressive force acting in the at least one transport direction is exerted on the at least one magnetic shape-memory element at least in the idle state or to permanently mechanically stretch the at least one magnetic shape-memory element such that a tensile force acting in the at least one transport direction is exerted on the at least one magnetic shape-memory element at least in the idle-state, wherein the compressive force or the tensile force causes to comprise at least one first partial region and at least one second partial region which differ from one another at least by their magnetic orientations, and to provide a transport volume for receiving the at least one medium, at least in the idle state.

2. The positive-displacement pump device according to claim 1, further comprising an electromagnetic magnet unit configured to move the at least one first partial region in the at least one transport direction.

3. The positive-displacement pump device according to claim 1, wherein, when measured in a direction perpendicular to the at least one transport direction, the at least one first partial region is smaller than the at least one second partial region.

4. The positive-displacement pump device according to claim 1, wherein the at least one magnetic shape-memory element comprises at least two first partial regions and at least two second partial regions.

5. The positive-displacement pump device according to claim 1, wherein the at least one mechanical deformation unit is at least partly arranged on an end section of the at least one magnetic shape-memory element.

6. The positive-displacement pump device according to claim 1, wherein the at least one mechanical deformation unit is arranged at least partly coaxially around the at least one magnetic shape-memory element.

7. The positive-displacement pump device according to claim 1, wherein the at least one mechanical deformation unit is configured for an adjustment of different deformation degrees of the deformation of the at least one magnetic shape-memory element.

8. The positive-displacement pump device according to claim 1, wherein the at least one mechanical deformation unit comprises at least one mechanism which, for the mechanical deformation, applies the compressive force and/or the tensile force to the at least one magnetic shape-memory element.

9. The positive-displacement pump device according to claim 8, wherein the at least one mechanism comprises at least one adjusting screw.

10. The positive-displacement pump device according to claim 1, wherein the at least one mechanical deformation unit comprises at least one permanent-magnetic magnet element.

11. The positive-displacement pump device according to claim 1, wherein a magnetic field main axis of a magnetic field provided by the at least one mechanical deformation unit is oriented at least substantially parallel to the at least one transport direction.

12. The positive-displacement pump device according to claim 1, further comprising at least one magnet unit which is configured for moving the at least one first partial region along the at least one transport direction and/or which is arranged at least partly coaxially around the at least one magnetic shape-memory element.

13. The positive-displacement pump device according to claim 12, wherein the at least one magnet unit comprises at least one magnet element that is realized as an electromagnetic magnet element.

14. The positive-displacement pump device according to claim 12, wherein the at least one magnet unit comprises at least one first magnet element and a second magnet element, which are arranged offset from one another along the at least one transport direction and/or which are actuatable separately from one another.

15. The positive-displacement pump device according to claim 12, further comprising at least one further magnet unit.

16. The positive-displacement pump device according to claim 15, wherein the at least one further magnet unit is arranged at least partly offset relative to the at least one magnet unit along the at least one transport direction and/or at least partly coaxially around the at least one magnet unit.

17. The positive-displacement pump device according to claim 12, further comprising at least one amplification unit, which is configured for amplifying a magnetic field provided by the at least one mechanical deformation unit and/or the at least one magnet unit.

18. The positive-displacement pump device according to claim 17, wherein the amplification unit is arranged such that it at least partially encompasses at least the at least one mechanical deformation unit and/or the at least one magnet unit.

19. The positive-displacement pump device according to claim 1, further comprising a compensation unit, which provides at least one magnetic field flowing through the at least one shape-memory unit and comprising a magnetic field main axis that is oriented at least transversely to the at least one transport direction.

20. The positive-displacement pump device according to claim 1, wherein the at least one shape-memory unit further comprises an envelope, which is configured for sealing the at least one magnetic shape-memory element off.

21. The positive-displacement pump device according to claim 20, wherein the at least one magnetic shape-memory element is enclosed by the envelope to a large extent or completely.

22. The positive-displacement pump device according to claim 20, wherein the envelope is elastically deformable.

23. A method for operating a positive-displacement pump device, in which a medium is conveyed at least by a magnetic shape-memory element of at least one shape-memory unit along at least one transport direction, the method comprising a method step of:

permanently mechanically deforming the magnetic shape-memory element in an idle state in which the positive-displacement pump device is free of a current and/or voltage supply, and that differs from an operation state in which the positive-displacement pump device actively conveys the medium along the at least one transport direction, wherein the magnetic shape-memory element is permanently mechanically compressed along the at least one transport direction such that a compressive force acting in the at least one transport direction is exerted on the magnetic shape-memory element at least in the idle state or permanently mechanically stretched along the at least one transport direction such that a tensile force acting in the at least one transport direction is exerted on the magnetical shape-memory element at least in the idle state, wherein the compressive force or the tensile force causes shape-memory element to comprise at least one first partial region and at least one second partial region, which differ from one another at least by their magnetic orientations, and to provide a transport volume for receiving the medium, at least in the idle state.

\* \* \* \* \*